United States Patent [19]

Sacks et al.

[11] 3,828,347

[45] Aug. 6, 1974

[54] ERROR CORRECTION FOR AN INTEGRATING ANALOG TO DIGITAL CONVERTER

[75] Inventors: Sidney M. Sacks, Monsey; Arnold J. Brand, Parsippany; William R. Slump, Glen Rock, all of N.J.

[73] Assignee: The Singer Company, Little Falls, N.J.

[22] Filed: May 24, 1973

[21] Appl. No.: 358,171

[52] U.S. Cl. .................... 340/347 AD, 340/347 NT
[51] Int. Cl. .......................................... H03k 13/00
[58] Field of Search................ 340/347 AD, 347 NT

[56] References Cited

UNITED STATES PATENTS

| | | | |
|---|---|---|---|
| 3,500,384 | 3/1970 | Naydan et al. | 340/347 NT |
| 3,577,140 | 5/1971 | Aasnaes | 340/347 NT |
| 3,582,947 | 6/1971 | Harrison | 340/347 NT |
| 3,649,826 | 3/1972 | Larsson et al. | 340/347 NT |

*Primary Examiner*—Malcolm A. Morrison
*Assistant Examiner*—Errol A. Krass
*Attorney, Agent, or Firm*—T. W. Kennedy

[57] ABSTRACT

An error correction circuit for use in an integrating analog to digital converter in which a test conversion is first made to establish a time period proportional to the error, which time period is then used as the fixed integrating time in a subsequent actual conversion.

7 Claims, 4 Drawing Figures

ERROR CORRECTION FOR AN INTEGRATING ANALOG TO DIGITAL CONVERTER

RELATED APPLICATIONS

This application is related to application Ser. No. 358,172 filed on May 7, 1973 and assigned to the same assignee as the present invention which application claims the octant determination circuit disclosed herein.

BACKGROUND OF THE INVENTION

This invention relates to analog to digital converters in general and more particularly to improvements in integrating analog to digital converters.

In a well known type of analog to digital converter an unknown voltage is provided to an integrator for a known time period T. At the end of that time, a known voltage of opposite polarity is provided to the integrator to cause it to integrate to zero and the crossing of zero detected. The time, t, to integrate back to zero, which time is stored by counting clock pulses, may be used to find the unknown voltage from the equation:

$$0{=}E_x\ T/RC - E_{ref}\ t/RC \text{ or } E_x = E_{ref}\ t/T$$

Where:

$E_x$ is the unknown voltage:

$E_{ref}$ is the known voltage, and $RC$ is the integrator time constant.

However, the voltages $E_x$ and $E_{ref}$ are normally provided by separate amplifiers each having a nominal gain of $K$. In actuality, because of tolerances, they will have gains of $K_1$ and $K_2$ where $K_1 = K_2$. This will cause the above equation to become:

$$E_x = K_2/K_1 E_{ref}\ t/T$$

And thus the result will be in error by a factor of $K_2/K_1$.

Converters of the same type are also used with syncros to convert inputs proportional to the sine and cosine of a shaft position angle $\theta$ to a tangent or cotangent in digital form. In that case, for example, $E_x = \sin\theta$ and $E_{ref} = \cos\theta$. The equation above becomes:

$$t = \sin\theta\ T/\cos\theta$$

$$t = \tan\theta\ T$$

Thus, the stored digital value of t is proportional to $\tan\theta$. (T being a known constant).

It is necessary in such use to determine in which octant the angle lies both to provide the necessary output data and to provide conversion information. That is, it is always desired to find whichever of the sine or cosine is less than one. And the polarities of sine and cosine must be known to permit integrating in both directions. Formerly this was done outside the converter requiring high accuracy comparators since correction during comparison was not feasible.

SUMMARY OF THE INVENTION

The converter of the present invention provides gain correction for the $K_2/K_1$ error described and also provides for determining the final bit of the octant determination during conversion avoiding the need for high accuracy conversions. The gain correction factor is obtained by first providing a test voltage to the two amplifiers involved. The conversion results in the equation:

$$K_2\ E_{test}\ T/RC - K_1\ E_{test}\ t_1/RC = 0 \quad t_1 = K_2/K_1\ T$$

The value $t_1$ is then used in place of $T$ during the actual conversion resulting in the cancelling of the error $K_2/K_1$.

The octant determination is made through the use of two comparators which narrow the angle to a given quadrant and then by determining the sign of the smaller signal, which is being integrated, after integration has proceeded for a time. This means that, even if this signal is very small, a correct sign will be detected because the voltage will have been increased sufficiently by the integration to permit accurate detection. Means are also shown which will permit detecting and correcting any error made in the initial comparisons.

THE DETAILED DESCRIPTION OF THE PREFERRED EMBODIMENT

Figures 1, 4:
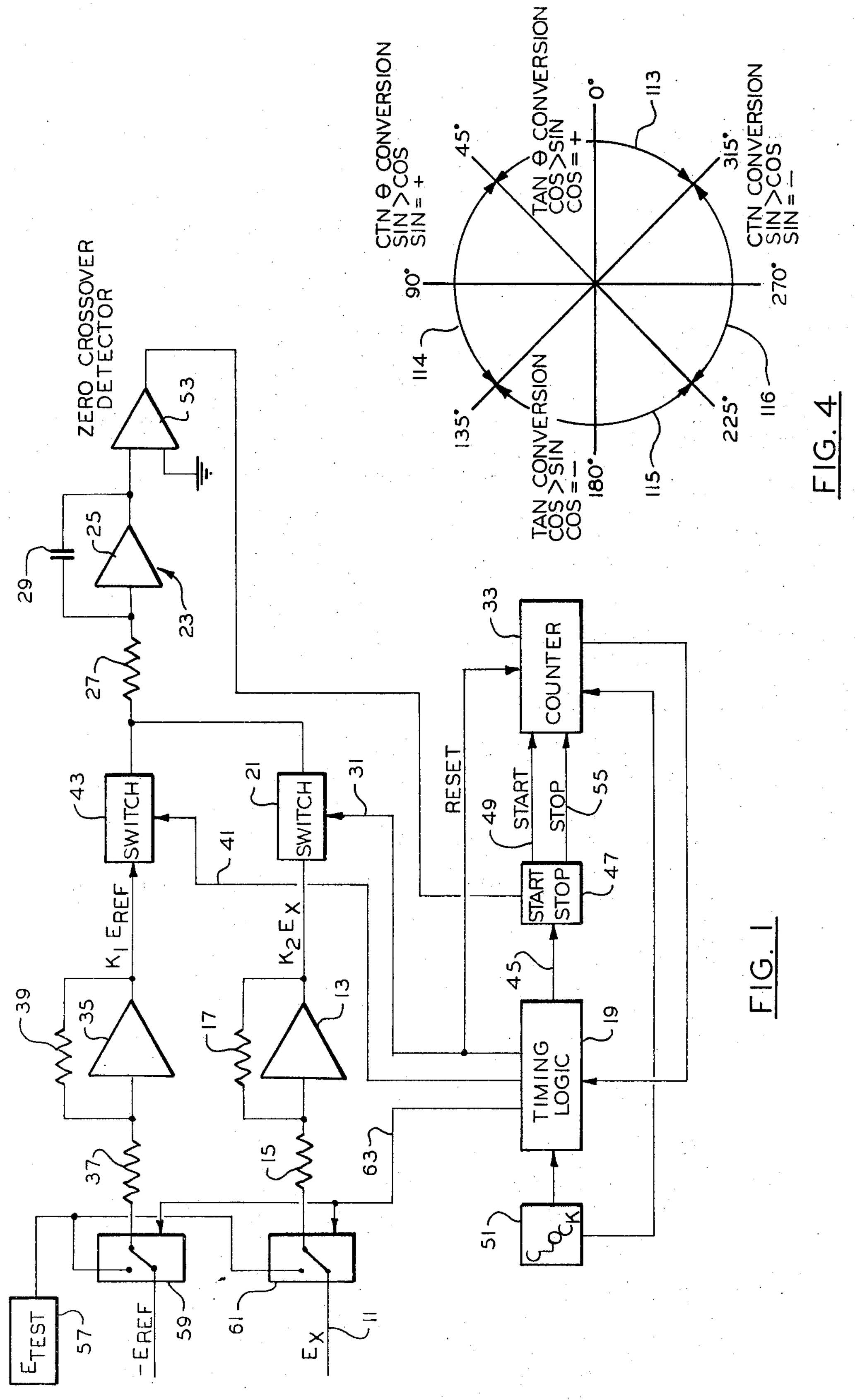
FIG. 1 is a circuit-block diagram of the preferred embodiment of the gain correction portion of the converter.
FIG. 4 is a diagram illustrating conditions in each octant and aids in understanding the comparator operation.

FIG. 1 is a block diagram of the preferred embodiment of the gain correction portion of the analog-to-digital converter. The converter is basically a standard integrating digital-to-analog converter and operates in the following manner. An unknown voltage, $E_x$, on line 11 is provided as an input to an amplifier 13 through a resistor 15. Amplifier 13 will have in its feedback path a resistor 17, which along with resistor 15 will determine the gain of the amplifier in a well-known manner. This amplification factor will be designated as $K_2$. Therefore, the output of amplifier 13 will be $K_2\ E_x$. A timing logic block 19 closes the switch 21 which may be, for example, a transistor switch. The output of amplifier 13 is thus provided to an integrator 23 comprising amplifier 25, input resistor 27, and feedback capicitor 29. The integration is allowed to continue for a fixed time period T, at the end of which, switch 21 will be opened by an output on line 31 from timing logic 19. The output closing switch will also provide a reset command to a counter 33. A reference voltage, $E_{ref}$ is provided as an input to an amplifier 35 having an input resistor 37 and a feedback resistor 39. The value of resistor 37 will be nominally the same as that of resistor 15 and the value of resistor 39 nominally the same as that of resistor 17 in order to obtain equal gain from both amplifier 13 and amplifier 35; however, it is impossible to obtain exactly the same gain. Thus, the output of amplifier 35 is designated as $K_1 \times E_{ref}$. After opening switch 21 and resetting counter 23, an output on line 41 from the timing logic 19, will close a switch 43 to switch the output of amplifier 35 into the integrator 23. At the same time, an output from timing logic 19 on line 45 is provided to a start-stop logic block 47 and will cause a start command on line 49 to be provided to the counter 33. This will permit pulses from clock 51 to be counted in the counter. Because the $E_{ref}$ is of opposite polarity from that of $E_x$, the integrator will begin integrating down towards 0. The output of the integrator is provided to a zero crossover detector 53 which will provide an output to the start stop logic 47 when the output of integrator 23 reaches 0. This output from detector 53 will cause a stop output from logic block 47 on line 55 to stop the counter. The result stored in counter 33 is described by the following equations:

$$K_1 E_x T/RC - K_2 E_{ref}t/RC = 0 \text{ or } t = K_1/K_2\ E_x/E_{ref}\ T$$

It can be seen from above that the answer is in error by the ratio of $K_1$ over $K_2$. If it were possible to build identical amplifiers 35 and 13, this error would not result. However, it must be recognized that such accuracy in amplifiers is not possible. Thus, some means must be provided to correct for this error. It should be restated at this point that what has been described so far is a type of analog-to-digital converter well-known in the prior art. It is in the manner of correcting this error of $K_1$ over $K_2$ with which the present invention is concerned, and which will now be described.

In the system of the present invention, there is provided in addition to the $E_{ref}$ and $E_x$ inputs, a voltage labeled $E_{test}$ in block 57. This voltage is provided to a single pole double throw switch 59, which has at its other input, the $E_{ref}$ voltage, and to a similar switch 61 which has as its other input, the $E_x$ voltage. The switches are shown as normal mechanical switches, however, in practice, they would normally be relays or possibly semi-conductor switches constructed in a manner well-known in the art. The operation of the switches is controlled by an input from timing logic on line 63. The present invention corrects for the error by making the fixed time interval T proportional to the ratio $K_2$ over $K_1$. Examination of the equation above will show that if this is the case, the $K_2$ and $K_1$'s will cancel, and the system will be without error. In operation, the switches 59 and 61 are closed to the voltage $E_{test}$ by an output from the timing module 19 on line 63. Switch 43 is then closed to allow the integrator 23 to integrate the output of amplifier 35 for a fixed time interval T. The switch 43 is then opened and input switch 21 closed to perform the integration in the opposite direction as described in connection with the normal operation of the converter above. The resulting numbers stored in counter 33 at the end of this conversion process is described by the below equations. This gives a value of $t_1$, which contains the required correction factor. This value of $t_1$ is then provided back to the timing logic 19 and stored there for use in the conversion. The switches 59 and 61 are returned to the position shown and the conversion process described above is completed. However, instead of using the fixed period T as the time period for the first integration, the stored value of $t_1$ will now be used, and the equations described above now become:

$$K_2 E_{test} T/RC - K_1 E_{test}/RC\ t_1 = 0 \quad t_1 = K_2/K_1\ T$$

$$K_1 E_x K_2/K_1\ t_1/RC - K_2 E_{ref}\ t_2/RC = 0 \quad t_2 = E_x/E_{ref}\ T$$

Thus, the ratio in the new time period being used effectively cancels out the gain error caused by the amplifiers 13 and 35.

Figure 2:
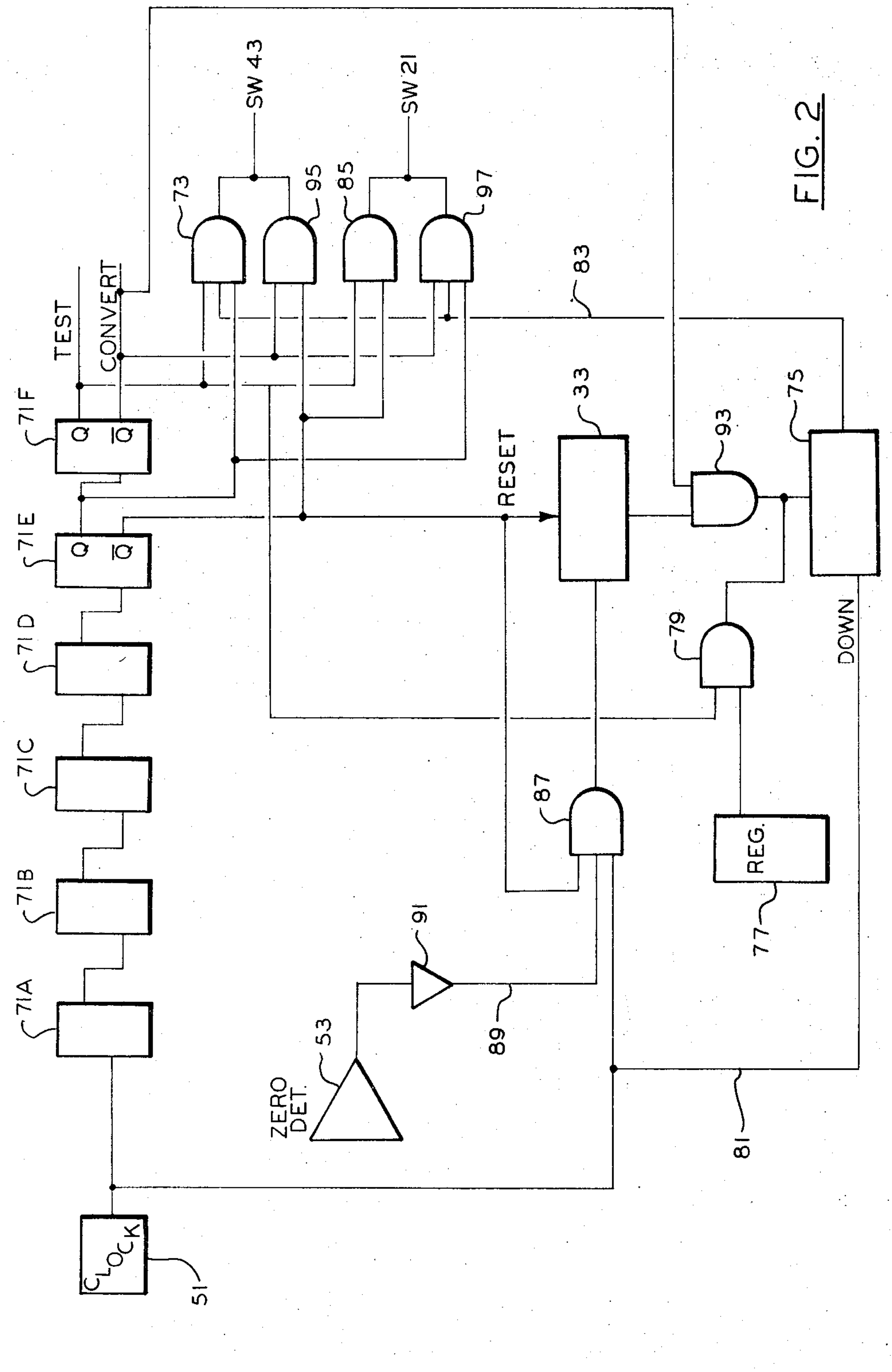
FIG. 2 is a logic diagram of timing logic associated with FIG. 1.

FIG. 2 shows in simplified form the timing logic 19 and start stop control 47 of FIG. 1. The output of clock 51 is divided down by a plurality of flip-flops 71 A-F. Although 6 flip-flops are shown here as an example, the number would depend on the actual system design and the resolution in the system. Flip-flop 71F will divide the total operating time into two time periods, one used for the test mode when the value of the time $t_1$ is being determined, and the other used for the convert mode. The Q output from flip-flop 71F will be on half the time, and the $\bar{Q}$ output the other half of the time. Flip-flop 71E will have a frequency output twice that of flip-flop 71F and thus will divide each time period from flip-flop 71F into two periods. That is to say, that during each of the test and convert periods, the Q output of flip-flop 71E will be present for half the time, and for the other half of the time, the $\bar{Q}$ output will be present. The outputs of flip-flop 71F are used to control the switches 59 and 61 described above. Thus, during the test period the Q output will be used to switch the switches 59 and 61 to the $E_{test}$ input 57. As described above, it is first desired in that mode to switch the output of amplifier 35 to the integrator for a predetermined period of time T. Thus, during the test portion the Q, or test output of flip-flop 71F is provided as one input to an And gate 73 and the Q output of flip-flop 71E as another input to And gate 73. The third input to And gate 73 is from a counter 75. The fixed time period T will be stored in a register 77. At the beginning of the test output from flip-flop 71, an output therefrom will enable an And gate 79 to the gate the value stored in the register to counter 75. The output from counter 75 will be present, enabling And gate 73 as long as there is a value stored in counter 75. Thus, at this point, the output from gate 73 is present and will close switch 43 causing the output of amplifier 35 to be integrated by integrator 23. At the same time clock pulses are being provided on line 81 to the down input of counter 75 counting down the numbers stored therein. When the count in counter 75 reaches 0, an output on line 83 will disable the gate 73 and open switch 43 causing the integrator 23 to remain at the last value input. At some point thereafter, the Q output of flipflop 71E will change from a high level to 0 disabiling gate 73, and the $\bar{Q}$ output will go high, enabling a gate 85. Gate 85 also has a second input, the Q output of 71F thus causing it to be enabled only during the test phase. The output of gate 85 during the second half of the test period is thus present and will close switch 21, causing the output of amplifier 13 to be provided to integrator 23. Upon the change of state of the $\bar{Q}$ output of flip-flop 71E from zero level to a high level, counter 33 will be reset. The high level will also enable an And gate 87 which has as its second and third inputs the clock output on line 81, and the zero detector input on line 89, which has first been inverted by an invertor 91. Since the zero detector will not have an output until the integrator is integrated down to zero, its output will be a low level, and after being inverted in inverter 91, a high level will be present on line 89 enabling And gate 87. Thus, clock pulses will pass through the And gate 87 and be counted in counter 33. When zero is sensed by the zero detector, the And gate 87 will be disabled and the count to that point will remain in counter 33. Flip-flop 71F will now go to the convert state having a $\bar{Q}$ output. The $\bar{Q}$ output will provide an input to a gate 93 causing the value which is stored in counter 33 to be transferred to counter 75. This output will also enable And gates 95 and 97. The second input to And gate 97 is from the Q output of flip-flop 71E. Its third input is from the counter 75 on line 83. Since the counter has a value in it, this output will be present along with the other inputs to And gate 97, and it will have an output which will close switch 21 causing the output of amplifier 13 to be provided to the integrator. As before, counter 75 will now be counter down, and when it reaches zero will disable And gate 97. However, now it will be counting down for the time period T multiplied by the gain error. When flip-flop 71E goes to the $\bar{Q}$ state, And gate 95 will be enabled closing switch 43 and causing the output of amplifier 35 to be provided to the integrator 23 which will then be integrated down to zero. As before, during this period, counter 33 will be receiving pulses from the clock. Again, upon an output from zero detector 53, the gate 87 will be disabled, and the count in counter 33 held. This count will now represent the final output, and may be transferred to the other devices as required.

One application for such a converter is in operating with synchro or resolver signals which have been converted to D.C. voltages proportional to the sine and cosine. One form of this conversion is accomplished by dividing the sine by the cosine or the cosine by the sine to obtain a tangent or co-tangent. In that case, the $E_x$ above would be, for example, the sine voltage and the $E_{ref}$, for example, the cosine voltage. Generally, in such a conversion, it is desired to have an output which is between zero and one. This is the reason that the cotangent and tangent functions are involved. The one which will provide this output of less than one is the one which will be used. The conventional method of performing such a conversion is first to determine the polarity of the sine input. This establishes whether the angle is greater or less than 180°. The next step is to determine the polarity of the cosine, and in conjunction with the 180° decision to determine which of the quadrants the angle is in. The final decision is made by comparing the sine with the cosine to find which is greater in absolute value to determine which 45° octant the angle is in and whether a tanget or cotangent function is to be provided. In the prior art, this was done using separate comparators which were normally separate from the conversion process. This type of system required that the comparator accuracies be compatible with the conversion accuracies.

Figure 3:
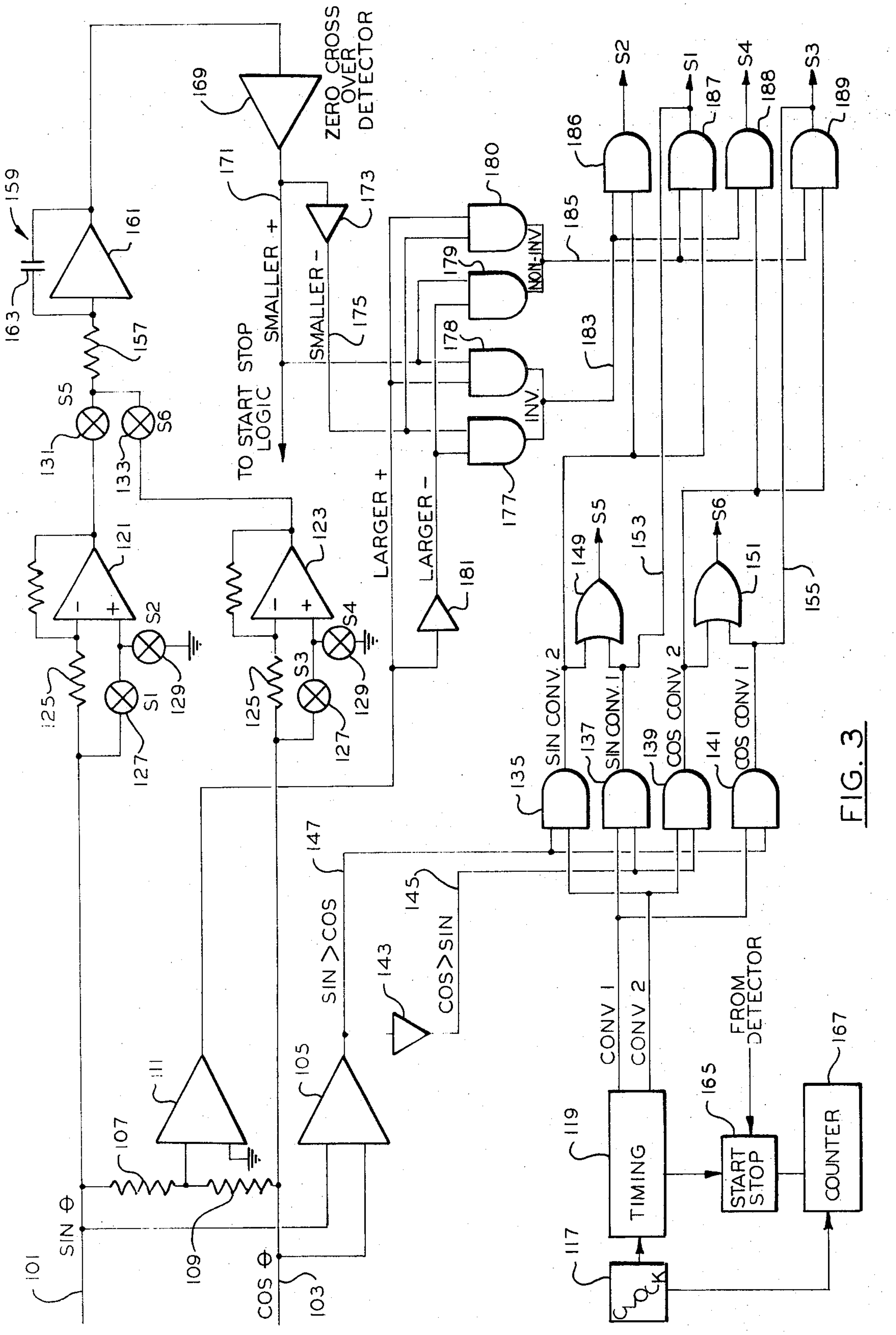
FIG. 3 is a circuit-block diagram of the preferred embodiment of the converter configured to perform a tangent or cotangent conversion and to provide octant information.

FIG. 3 shows a simplified way of performing these comparisons within the convertor itself. The convertor portion of the cirucit of FIG. 3 operates in a manner similar to that described above in connection with FIGS. 1 and 2 and will preferably include the error-correcting apparatus described. This error-correcting portion of the circuit is not included on FIG. 3 to keep the figure as simple as possible. The sin $\theta$ and cos $\theta$ inputs are provided respectively on lines 101 and 103. These two inputs are provided to a comparator 105 which will compare their absolute values and provide an output at a first level when the sine is greater than the cosine and at a second level when the cosine is greater than sine. The inputs are also provided to a resistor divider comprising resistors 107 and 109; the junction of which is provided as an input to a second comparator 111 referenced to ground. The voltage at the junction of the two resistors, which resistor will be of equal value, will have the sign of whichever of the sine or cosine of theta is larger. This will cause comparator 111 to output a signal at one level if the larger of the two inputs is positive and at a second level if the larger of the two signals is negative. These first two comparisons identify the angle as being within one of the four quadrants indicated by FIG. 4. The four quadrants are indicated respectively by reference numbers 113–116, and the conditions associated with each of the quadrants are clearly labeled on the Figure. It only remains, then, to find out the sign of the smaller of the two signals to determine in which octant the angle lies. This is done implicitly during the conversion, as will be seen below.

Timing circuits such as those described in connection with FIG. 2, will divide down an input from clock 117 in a block indicated as a timing block 119 and provide two outputs labeled convert-1 and convert-2. In order to always obtain a tangent or co-tangent value which is less than 1, the smaller of the sign or co-sign input must be converted first as will become evident below. The inputs on lines 101 and 103 are provided respectively to amplifiers 121 and 123. Each amplifier has an input through a resistor 125 to its inverting input and through a switch S1 or S3 to its non-inverting input. Also provided is a switch S2 or S4 which can ground the non-inverting input. The outputs are provided respectively to switches S5 and S6. The selection of switch S5 or S6 will determine which of the outputs of amplifiers 121 and 123 is provided to the remainder of the encoder. During the first conversion period, the one of the two switches, S5 and S6 which has an input the smaller of the sine or cosine through amplifiers 121 and 123 must be closed. This is accomplished by Anding in And gates 135, 137, 139, and 141 the outputs of the timing block 110 and of comparator 105. Comparator 105 has connected to its output an inverter 143 which will invert the level provided at its output. Thus, assuming that the converter 105 will put out a high output when the sine is greater than the cosine and a low output when the cosine is greater than the sine, the output of the inverter 143 on line 145 will assume the opposite state. In this manner, a high output will be present at the output of comparator 105 on line 147 when the sine is greater than the cosine and a high output will be present on line 145 when the cosine is greater than the sine. The sine greater than cosine output on line 147 is provided as an input to gates 135 and 141. Gate 135 has as its second input the output from timer 110 indicating conversion period 2 and gate 141 has as its second input the output from timer 119 indicating conversion period 1. The cosine greater than sine output is provided on line 145 to gates 137 and 139 which have as their respective second inputs the conversion period 1 and conversion period 2 outputs of timer 119. If, for example, the sine is samller than the cosine during the first conversion period gate 137 will have an output. This will be provided through Or gate 149 to switch S5, thus causing the sine to be encoded as will be explained below. During the second conversion period gate 139 will be enabled, and its output will be provided through Or gate 151 to activate switch S6. If the sine is greater than the cosine during the first time period, gate 141 will have an output which will be provided through gate 151 to S6 and during the second conversion period the output of gate 135 will be present and will be provided through Or gate 149 to S5. During the first conversion period no polarity inversion is desired through amplifiers 121 and 123. Thus, the output of gate 137 is provided on a line 153 to S1 and the output of gate 141 is provided on a line 155 to S3. This will cause the input during the first conversion period to be provided to the non-inverting input of one of the respective amplifiers 121 or 123 depending on the selection logic described above. The signal from switch S5 or S6 is provided through a resistor 157 to an integrator 159 comprising amplifier 161 and feedback capacitor 163, and is integrated in a manner similar to that described above for a fixed time period T. This will be done in the same manner as described in connection with FIG. 1 above. In FIG. 3, timing logic 119 corresponds to the timing logic 19 of FIG. 1, start-stop block 165 corresponds to the block 47 of the same name and counter 167 to counter 33. The output of integrator 159 is provided to a zero crossover detector 169. The output of zero crossover detector will have a level dependent upon the sine of the input signal. This is the final bit of information needed to define the octant in which the angle is located. Thus, the output of zero crossover detector 169 will, for example, be positive if the input is positive and negative if the input is negative. This output on line 171 may then be used to provide the final bit of the octant output. The output on line 171 is also provided to an inverter 173 which will have on its output line the inverse of line 171. The outputs on lines 171 and 175 are used along with the output of comparator 111 as inputs to gates 177 through 180 which determine whether or not the signal converted during the second conversion is to be inverted or not.

Since the initial signal which was converted may have been positive or negative, there being no inversion in either amplifier 121 or 123, the output of integrator 161 similarly may be negative or positive. The signal provided during the second conversion period, which will be used to integrate the integrator 159 back to zero in the manner described above in connection with FIG. 1, must be of an opposite polarity. In general, an inversion is required if the polarities of both signals are the same. If the polarities are different, then no inversion is required. If an inversion is required, then switch S2 or S4 must be enabled and switch S1 and S3 must not be enabled. In this way, the input is provided into the resistor 125 and thence to the inverting input of the amplifier. If no inversion is required, then switch S1 or S3 must be closed, and switch S2 or S4 remain open as was done during the first conversion. Gate 177, which has as its input the output of inverter 173 on line 175 and also the output of an inverter 181 having its input from comparator 111, will provide an output if both signals are negative. Similarly, gate 178 has as inputs the output of comparator 111 and the output on line 171, and will provide an output if both inputs are positive. Gate 179 has as inputs the output of inverter 181 and the output from line 171. Gate 180 has as inputs the output of comparator 111 and the output of inverter 173 on line 175. Gate 170 will provide an output if the smaller signal is positive and the larger signal negative, and gate 180 will have an output if the smaller signal is negative, and the larger signal positive. The outputs of gates 177 and 178 are tied together in a line 183 which indicates that the input for the second conversion must be inverted. Similarly, the outputs of gates 179 and 180 are tied together in a line 185 indicating that no inversion is required during the second conversion. These outputs must then be provided to the switches S1, S2, S3 and S4 depending on which of the sine or cosine is being converted on the first and second conversions. To accomplish this, they are Anded in gates 186–189 with the outputs of gates 135 and 139. Gates 186 and 187 receive an enabling input from gate 135 indicating that the sine is being converted during the second conversion period. Gate 186 has as its second input the invert signal on line 83 and gate 187 has as its second input the non-invert signal on line 185. The respective outputs of gates 186 and 187 are provided to S2 and S1 so that, if inversion is required, S2 will be closed, and if not required, S1 will be closed. Similarly, gates 188 and 189 are enabled by the output of gate 139 indicating that the cosine is being converted during conversion period 2. Gate 188 has as its second input the invert signal on line 183 and gate 189, and non-invert signal on line 185. Their outputs are provided respectively to S4 and S3, causing S4 to be closed when an inversion is desired, and S3 to be closed when an inversion is not needed.

The output of zero crossover detector 169 on line 171 is also provided to start stop logic 165. In the manner similar to that described above when, during the second conversion period, the integrator 159 reaches zero, the output of crossover detector 169, indicating that zero has been reached, will cause the counter 167 to be disabled. The counter 167 will be then storing a digital representation of the tangent or co-tangent. During the first conversion, the value stored in the integrator 169, assuming that the sine $\theta$ was the smaller will be equal to Sin $\theta$ T/RC. During the second conversion, the valve integrated down would be equal to the Cos $\theta$ T/RC. The result when these two are subtracted must be equal to zero. This results in the equation below:

$$\text{Sin}\ \theta\ T/RC - \text{Cos}\ \theta\ t/RC = 0$$

$$t = T \tan \theta$$

Because the sine of the smaller signal was determined by the integrator and the converter itself, there is no ambiguity nor is there a requirement for highly accurate comparators. The only real ambiguity which might result is where the angle is close to 45° and comparator 111 makes a wrong decision as to the sine of the larger input. This will result in the $t$ timing interval in counter 167 exceeding the T timing interval. To compensate for this, counter 167 may be made an up-down counter and logic included to cause it to begin to count down if it becomes filled. This will result in an answer which is approximately correct. The change in state from up to down may then also be used to correct the output of comparator 111 which will have been in error.

Thus, the method and apparatus of correcting error in an integrator counter type analog digital converter has been shown. Also shown is a method of determining in which octant an angle lies when such a converter is being used to provide a shyncro to digital conversion. Although specific embodiments have been shown and described, it will be obvious to those skilled in the art that various modifications may be made without departing from the spirit of the invention which is intended to be limited solely by the appended claims.

What is claimed is:

1. In an analog to digital converter comprising at least a first input amplifier having a gain $K_1$ and having as an input a known voltage $E_{ref}$ and providing an output of $-K_1 E_{ref}$, a second input amplifier having a gain $K_2$ and having as an input an unknown voltage $E_x$ and providing an output $K_2 E_x$ where $K_1$ and $K_2$ are nominally equal but differ due to component tolerances, an integrator, means to cause said output $K_2 E_x$ to be integrated for a fixed time period T and thereafter said output $-K_1 E_{ref}$ to be integrated, means to detect the output of said integrator crossing zero, and means to store in digital from the time t, required for said voltage $-K_1 E_{ref}$ to cause said integrator to cross zero said time, t, being equal to $K_1E_x T/K_2 E_{ref}$ from which $E_x$ may be found, a method of eliminating the scale factor error $K_1$ comprising:

a. providing, prior to conversion of $E_x$ and $E_{ref}$, a test voltage $E_{test}$ to each of the first and second amplifiers;

b. providing the output $-K_1 E_{test}$ of said first amplifier to said integrator for a fixed time period T;

c. providing the output $K_2 E_{test}$ of said second amplifier to said integrator to integrate it back to zero;

d. measuring and storing the time $t_1$ required to integrate back to zero whereby $t_1$ will equal $K_2 T/K_1$;

e. using the value of $t_1$ in place of T when performing the integration of $K_2 E_x$ whereby the value $t_2$ of t will now equal $K_1E_xK_2/K_2E_{ref}K_1$ T or $E_x T/E_{ref}$ thereby causing the error $K_1/K_2$ to be cancelled.

2. The invention according to claim 1 wherein said time T is obtained by counting down a counter having the digital equivalent of T stored therein and said value $t_1$ is obtained by counting up a counter from the time of providing the voltage $K_2 E_{test}$ to the integrator until zero is crossed.

3. In an analog to digital converter comprising at least a first amplifier having a gain $K_1$ and having as an input a known voltage $E_{ref}$ and providing an output of $-K_1 E_{ref}$ a second input amplifier having a gain $K_2$ and having as an input an unknown voltage $E_x$ and providing an output $K_2 E_x$ where $K_1$ and $K_2$ are nominally equal but differ due to component tolerances, an integrator, means to cause said output $K_2 E_x$ to be integrated for a fixed time period T and thereafter said output $-K_1 E_{ref}$ to be integrated, means to detect the output of said integrator crossing zero, and means to store in digital from the time $t$, required for said voltage $-K_1 E_{ref}$ to cause said integrator to cross zero said time, $t$, being equal to $K_1E_x T/K_2 E_{ref}$ from which $E_x$ may be found, an apparatus for eliminating the scale factor error $K_1/K_2$ comprising:

a. a voltage source, $E_{test}$;

b. means to couple said source to each of the first and second amplifiers;

c. means to couple the output, $-K_1 E_{test}$, of the first amplifier to the integrater for a fixed time T;

d. means to couple the output $K_2 E_{test}$ of the second amplifier to said integrator after said time, T;

e. a counter;

f. a clock;

g. means to provide the output of said clock to said counter upon the output of said second amplifier being provided to said integrator;

h. means to disconnect said clock from said counter upon the sensing of the detecting means of a zero crossing; and i. means to provide the value stored in said counter as the fixed time for the integration of $K_2 E_x$.

4. The invention according to claim 3 wherein said means to couple said voltage source, means to couple said first amplifier, and means to couple said second amplifier comprise:

a. a first switch having as inputs $E_{test}$ and $E_{ref}$ and providing its output to said first amplifier;

b. a second switch having as inputs $E_{test}$ and $E_x$ and providing its output to said second amplifier;

c. a third switch coupling said first amplifier to said integrator;

d. a fourth switch coupling said second amplifier to said integrator; and e. timing means having a first output coupled to said first and second switches which when present will couple $E_{test}$ as the respective outputs of said first and second switches and when absent will couple $-E_{ref}$ and $E_x$ as the respective outputs of said first and second switches, said first output being present and absent for alternate essentially equal time periods, a second output coupled to said third switch and adapted to be present closing said switch approximately the first half of the time said first ouptut is present and the second half of the time said first output is absent said third switch being open at all other times, and a third output coupled to said fourth switch adapted to close said fourth switch during the time periods when said third switch is open.

5. The invention according to claim 4 wherein said means to provide the output of said clock and the means to disconnect said clock comprise start - stop logic having as inputs said third timing output signal and the output the zero crossover detector and responsive to the beginning of said third signal to couple said clock and to the output of said zero crossover detector to disconnect said clock.

6. In an analog to digital converter comprising at least a first input amplifier providing an unknown voltage, a second input amplifier providing a known voltage, an integrator, means to cause the output of a first amplifier to be integrated by said integrator for a fixed time period and then to integrate the output of said second amplifier in an opposite direction, means to detect said integrator crossing zero and means to store in digital form the time of said integration to zero, apparatus to correct for errors resulting from said first and second amplifiers having different gains comprising, means to perform a test conversion prior to each unknown conversion to develop a correction factor in the form of a time value to be used in the first integration during the unknown conversion.

7. The invention according to claim 6 wherein said means to perform said test conversion comprise: means to provide a test voltage to each of said first and second amplifiers; means to invert the sequence of providing outputs of said first and second amplifiers to said integrator and means to store the time obtained during the second integration for use in the unknown conversion.

* * * * *